(12) United States Patent
Chipaux et al.

(10) Patent No.: US 10,571,498 B2
(45) Date of Patent: Feb. 25, 2020

(54) SYSTEM FOR ANALYSIS OF A MICROWAVE FREQUENCY SIGNAL BY IMAGING

(71) Applicants: THALES, Courbevoie (FR); UNIVERSITAET LEIPZIG, Leipzig (DE)

(72) Inventors: Mayeul Chipaux, Winsum (NL); Loic Toraille, Paris (FR); Thierry Debuisschert, Orsay (FR); Christian Larat, Paris (FR); Loic Morvan, Orsay (FR); Jan Meijer, Bochum (DE); Sébastien Pezzagna, Leipzig (DE)

(73) Assignees: THALES, Courbevoie (FR); UNIVERSITAET LEIPZIG, Leipzig (DE)

( * ) Notice: Subject to any disclaimer, the term of this patent is extended or adjusted under 35 U.S.C. 154(b) by 309 days.

(21) Appl. No.: 15/522,265

(22) PCT Filed: Oct. 22, 2015

(86) PCT No.: PCT/EP2015/074544
§ 371 (c)(1),
(2) Date: Apr. 26, 2017

(87) PCT Pub. No.: WO2016/066532
PCT Pub. Date: May 6, 2016

(65) Prior Publication Data
US 2017/0322244 A1   Nov. 9, 2017

(30) Foreign Application Priority Data

Oct. 28, 2014 (FR) ...................................... 1402429

(51) Int. Cl.
*G01R 23/163* (2006.01)
*G01R 23/17* (2006.01)
(Continued)

(52) U.S. Cl.
CPC ........... *G01R 23/163* (2013.01); *G01R 23/17* (2013.01); *G01R 29/0878* (2013.01); *G01R 33/32* (2013.01); *G01R 33/60* (2013.01)

(58) Field of Classification Search
CPC .. G01R 23/163; G01R 23/17; G01R 29/0878; G01R 33/32; G01R 33/60
See application file for complete search history.

(56) References Cited

U.S. PATENT DOCUMENTS

| 2004/0100278 | A1* | 5/2004 | Haycock | ................ | G01R 33/60 |
| | | | | | 324/637 |
| 2014/0097841 | A1* | 4/2014 | Yang | ..................... | G01N 24/10 |
| | | | | | 324/316 |

FOREIGN PATENT DOCUMENTS

WO    2013/188732 A1    12/2013

OTHER PUBLICATIONS

Mayeul Chipaux, et al., "Nitrogen Vacancies (NV) Centers in Diamond for Magnetic Sensors and Quantum Sensing", Proceedings of SPIE, Jan. 15, 2015, pp. 93701V-1-93701V-6, vol. 9370, International Society for Optical Engineering, XP060044828.

* cited by examiner

*Primary Examiner* — Patrick Assouad
*Assistant Examiner* — Feba Pothen
(74) *Attorney, Agent, or Firm* — Baker & Hostetler LLP

(57) ABSTRACT

A system for analyzing a microwave-frequency signal by imaging is provided, comprising:
a solid material at least one optical property of which is modifiable in at least one zone of the material, when the zone is simultaneously in the presence of an optical excitation or electrical excitation and a microwave-frequency signal having at least one frequency coinciding with a resonant frequency of the material, (Continued)

the material furthermore being such that a value of the resonant frequency varies as a function of the amplitude of a magnetic field, a magnetic field generator configured to generate a magnetic field having, in the interior of a portion of the zone, a spatial amplitude variation in a direction X, the material then having a resonant frequency that is dependent on a position in the direction X, and a detector configured to receive an image of the zone in said direction X.

19 Claims, 12 Drawing Sheets

(51) Int. Cl.
  *G01R 29/08* (2006.01)
  *G01R 33/32* (2006.01)
  *G01R 33/60* (2006.01)

SYSTEM FOR ANALYSIS OF A MICROWAVE FREQUENCY SIGNAL BY IMAGING

CROSS-REFERENCE TO RELATED APPLICATIONS

This application is a National Stage of International patent application PCT/EP2015/074544, filed on Oct. 22, 2015, which claims priority to foreign French patent application No. FR 1402429, filed on Oct. 28, 2014, the disclosures of which are incorporated by reference in their entirety.

FIELD OF THE INVENTION

The present invention relates to the field of analysis of a microwave-frequency signal, the frequency of which is typically comprised between a view hundred MHz and a few tens of GHz. More particularly, the invention is applicable to the spectral analysis of the microwave-frequency signal.

BACKGROUND

The spectral analysis of microwave-frequency signals consists in identifying the frequency components of an unknown signal, and optionally their respective amplitudes.

Commercially available spectrum analyzers intended for signal characterization operate in the following way: the input signal is demodulated by mixing it with the signal of a local oscillator. After low pass filtering, the components present in a narrow band about the frequency of the local oscillator are obtained. It is then necessary to scan the frequency of the local oscillator in order to obtain all the information on the input signal, in a large spectral window.

The main drawback of this solution is that it is intrinsically slow because of the scan. In addition, it requires complex electronics and is therefore costly and bulky.

Lastly, in the case of signals that vary as a function of time, the prior art does not allow all of the spectral window to be monitored at the same time (unless one analyzer is employed for each band). The probability of interception of the signals is at best a few %.

For applications requiring an interception probability as close as possible to 100%, an alternative solution is to directly digitize the input signal over the largest possible passband, then to apply Fourier transforms to the samples obtained. This solution has two limits:
The best input passband achievable with current analogue-digital converters is less than 10 GHz, and they also have dynamic ranges that are far lower than those required (mainly because of sampling jitter and conversion nonlinearities).
The rate at which the data must be transmitted and processed is considerable (several hundred Gb/s and several Tflops) leading to a prohibitively high price, power consumption and volume.

Although the ability of processors to process and manage data delivered at high rates is improving very rapidly (Moore's law), the same does not go for the performance of very-wideband analogue-digital converters, which is limited by the fundamental properties of the electronic components employed.

One aim of the present invention is to mitigate the aforementioned drawbacks by providing a system and method for analyzing a spectrum allowing an "image" of the complete spectrum of an input signal to be obtained over a wide band, without scanning nor digitization or processing.

DESCRIPTION OF THE INVENTION

According to a first aspect, the subject of the present invention is a system for analyzing a microwave-frequency signal by imaging, comprising:
a solid material at least one optical property of which is modifiable in at least one zone of the material, when the zone is simultaneously in the presence of an optical excitation or electrical excitation and a microwave-frequency signal having at least one frequency coinciding with a resonant frequency of the material,
said material furthermore being such that a value of said resonant frequency varies as a function of the amplitude of a magnetic field,
a magnetic field generator configured to generate a magnetic field having, in the interior of a portion of said zone, a spatial amplitude variation in a direction X, said material then having a resonant frequency ($F_R(x)$) that is dependent on a position in said direction X, and
a detector configured to receive an image of the zone in the direction X, the image containing at least one intensity variation resulting from the modification of the optical property, a position of which in the spectral image depends on a corresponding frequency value of the microwave frequency signal to be analyzed illuminating the zone of the material, when the zone is simultaneously in the presence of an optical excitation or electrical excitation and said magnetic field.

Advantageously, the material is of planar geometry, the direction X being substantially contained in a plane of the material.

Advantageously, the material is a crystal comprising color centers.

According to one embodiment, the crystal is a diamond substrate comprising NV centers in the crystal lattice of the substrate, each NV center consisting of a nitrogen atom substituted for a carbon atom and coupled to a vacancy, the nitrogen-atom/vacancy pair forming a color center in the crystal lattice. According to one variant, the optical property is an absorption of a probe optical beam passing through said zone, the modification consisting of a variation in said absorption of the probe optical beam by the zone of the material.

According to another variant, the optical property is a luminescence, the modification consisting of a variation in a light intensity of said zone, the system furthermore comprising an optical system configured to image said zone on said detector.

Advantageously, the NV centers of the diamond substrate have a preferred direction among the four possible directions.

Advantageously, the preferred direction of the NV centers is located in a plane of the material.

Advantageously, the preferred direction of the NV centers corresponds to the direction X.

Advantageously, the magnetic field generator is configured so that the spatial variation in the amplitude of the magnetic field is monotonic in X in said portion of the zone.

Advantageously, the magnetic field generator is configured so that the direction of the magnetic field is substantially aligned with a direction of the NV centers.

Advantageously, the magnetic field generator is configured so that the direction of the magnetic field is contained in a plane of the material.

Advantageously, the magnetic field generator is configured so that the direction of the magnetic field is parallel to the direction X.

Advantageously, the magnetic field generator is configured so that the amplitude of the magnetic field is substantially constant in a direction Z perpendicular to a plane of the material.

According to one embodiment, the system according to the invention furthermore comprises an emitting antenna placed in proximity to the material and connected to a coaxial cable inside of which the microwave-frequency signal to be analyzed propagates.

As a variant, the system according to the invention furthermore comprises a processing device configured to acquire a plurality of images at successive times and to generate a two-dimensional synthetic image by juxtaposing the acquired spectral images, so as to visually render a variation in the spectrum of the microwave-frequency signal to be analyzed as a function of time.

According to another aspect, the invention relates to a method for analyzing a microwave-frequency signal by imaging, comprising the steps consisting in:

optically or electrically exciting a zone of a solid material at least one optical property of which is modifiable in said zone when said zone is simultaneously in the presence of said excitation and a microwave-frequency signal having at least one frequency coinciding with a resonant frequency of the material, the material furthermore being such that a value of the resonant frequency varies as a function of the amplitude of a magnetic field, generating a magnetic field having, in the interior of a portion of said zone, a spatial amplitude variation, said material then having a resonant frequency that is dependent on a position in said direction X, receiving on a detector an image of said zone in said direction X, the image containing at least one intensity variation, a position of which in said image depends on a corresponding frequency value of said microwave frequency signal to be analyzed illuminating said material, when said portion of the zone of the material is simultaneously optically or electrically excited and subjected to said magnetic field.

According to one embodiment, the method according to the invention furthermore comprises steps consisting in acquiring a plurality of images at successive times and in generating a two-dimensional synthetic image by juxtaposing the acquired images, so as to visually render a variation in the spectrum of the microwave-frequency signal to be analyzed as a function of time.

Advantageously, the method according to the invention furthermore comprises a calibrating step consisting in generating a synthetic image from a mono-frequency microwave-frequency signal the frequency of which varies as a function of time according to a known law, so as to obtain a correspondence between position in the image and resonant frequency.

BRIEF DESCRIPTION OF THE DRAWINGS

Other features, aims and advantages of the present invention will become apparent on reading the following detailed description and with reference to the appended drawings, which are given by way of nonlimiting example and in which.

DETAILED DESCRIPTION OF THE INVENTION

Figure 1:
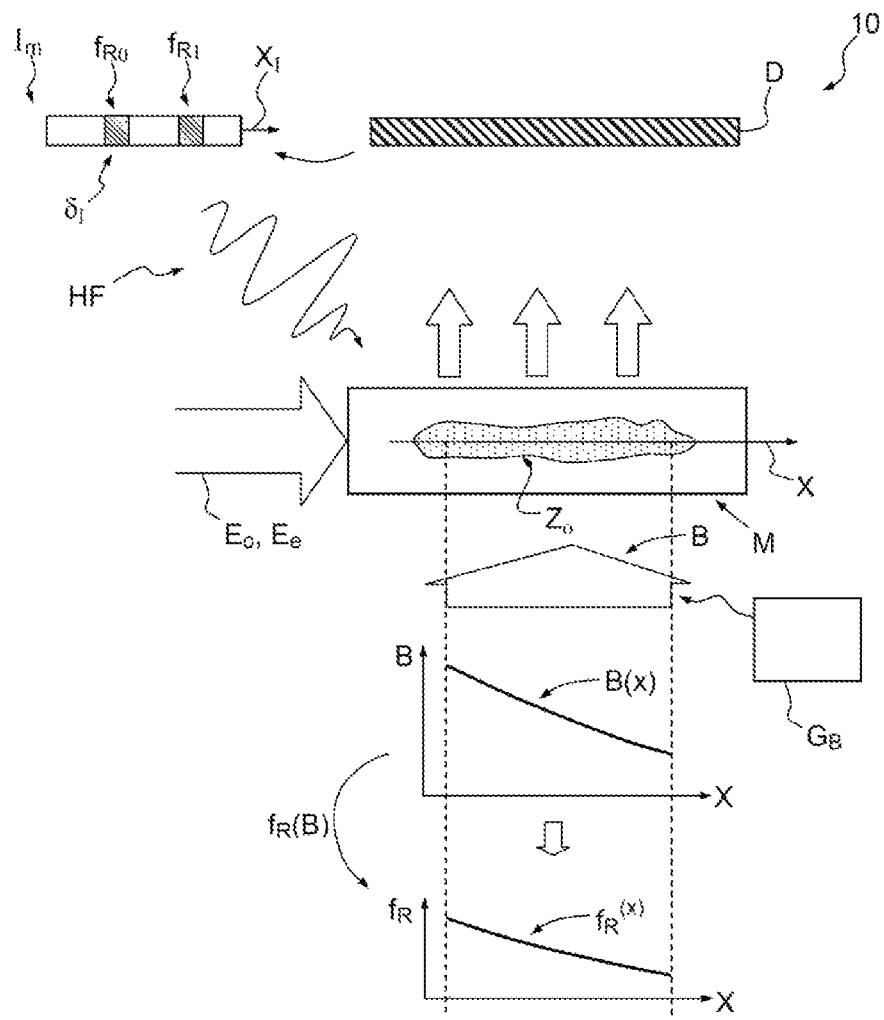
FIG. 1 depicts a spectral analyzing system according to the invention.

FIG. 1 depicts a system 10 for analyzing a microwave-frequency signal HF by imaging according to the invention. The system is preferably applied to microwave-frequency signals of frequency comprised between a view hundred MHz and a few tens of GHz. The system 10 comprises a solid material M at least one optical property of which is modifiable in at least one zone Zo of the material, when this zone is simultaneously in the presence of an optical excitation Eo or an electrical excitation Ee and a microwave-frequency signal HF having at least one frequency coinciding with a resonant frequency $f_R$ of the material. Examples of optical properties are given below.

The solid material M is furthermore such that a value of the resonant frequency $f_R$ varies as a function of the amplitude of a magnetic field B. An example of a physical effect allowing this effect to be obtained is detailed below.

The system furthermore comprises a magnetic field generator $G_B$ configured to generate a magnetic field B having, in the interior of a portion of the zone Zo, a spatial amplitude variation B(x) in a direction X.

Because of the dependence of the resonant frequency on B, the material therefore has a resonant frequency $f_R(x)$ that is a function of a position x in the direction X. Thus, in the presence of a microwave-frequency signal of frequency coinciding with a resonant frequency $f_{RO}$ of the material, an optical property of the material is modified at $x_0$ along X, $x_0$ being the position corresponding to the frequency $f_{RO}$. This optical-property variation causes a local variation in light energy at $x_0$. In this way, the frequency information is spatially and optically encoded into the material M, and a direct relationship is obtained between the position x in the zone Zo of the material and the associated resonant frequency $f_R(x)$.

Lastly, the system 10 comprises a detector D configured to receive an image Im of the zone Zo, and more particularly of the portion of the zone Zo containing a controlled variation in magnetic field B in the direction X. The coding of the spectral information is one-dimensional and the detector D is either one-dimensional or two-dimensional.

Thus the image Im contains at least one intensity variation $\delta I$ resulting from the modification of the optical property, the position of which in the image Im depends on the corresponding frequency value of the microwave-frequency signal HF to be analyzed illuminating the zone Zo of the material, when this zone is simultaneously in the presence of an optical excitation Eo or electrical excitation Ee and the magnetic field B.

The system 10 thus directly delivers a "projection" of the complete spectrum of the signal HF to be analyzed over a wideband, without digitization or processing. The spectral information is spatially encoded in the direction X of the solid material M. A corresponding spatial code is found in the image Im in a direction $X_I$.

One advantage of the system 10 according to the invention is that it analyses all the frequencies of the signal HF at the same time. The system 10 is therefore more rapid than a conventional scan-based system. In addition, because of its simplicity, it is less expensive and more compact.

As a variant, the image Im once detected by D undergoes processing to improve the quality and readability of the spectral information.

Preferably, the solid material M has a planar geometry, and the direction X is substantially contained in a plane of the material. This geometry makes the imaging simpler to implement and corresponds to the geometry of a type of crystal allowing the physical effects described above to be obtained. Preferably, the material is a crystal comprising color centers. Below, by way of example, the operation of the system 10 will be described for a material of this type. The crystal is for example an SiC substrate, or preferably a diamond substrate containing NV centers in the crystal lattice of the substrate, each NV center consisting of a nitrogen atom substituted for a carbon atom and coupled to a vacancy, the nitrogen-atom/vacancy pair forming a color center in the crystal lattice.

An NV center is a point defect in the crystal lattice, for example of diamond, formed by a nitrogen atom (N) that has substituted for a carbon atom and coupled with a vacancy in an adjacent site of the crystal lattice (V for vacancy).

The obtention of NV centers in diamond is a well-mastered process. Diamonds of large size are produced by a chemical vapor deposition (CVD) process, typically in the form of parallelepipeds of a plurality of mm side length and of several hundred μm thickness.

The NV centers may be created by ion implantation of nitrogen atoms. They may also be created by incorporating the nitrogen in a controlled way during the growth of the diamond using the delta doping method. Once grown, the diamond is annealed (800° C.) so that the vacancies and nitrogen purities combine to form the NV centers. The NV centers are either created in the bulk of the crystal or in uniform layers near the surface.

The nitrogen-plus-vacancy system forming the NV center thus constitutes an "artificial atom" trapped within the diamond matrix and optically detectable on the individual scale by microscopy. An NV center possesses a very precise location that does not change over time.

Figure 5:
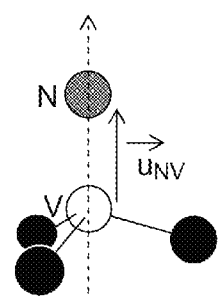
FIG. 5 illustrates the axis of quantization of an NV center, corresponding to the axis joining the nitrogen atom to the vacancy.

The axis between the vacancy and the nitrogen atom is the quantization axis $u_{NV}$ of the NV center (illustrated in FIG. 5). Because of the symmetry of the crystal, this axis may have one of four different orientations.

Figure 2:
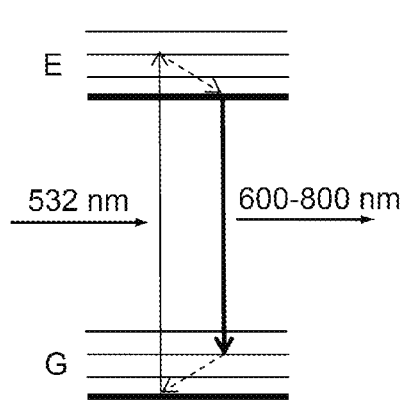
FIG. 2 illustrates the ground-state and excited levels of the NV center in a crystal matrix.

The NV center possesses ground-state and excited energy levels G, E, as illustrated in FIG. 2. The NV center is excited by optical pumping in the green (for example at 532 nm). The NV centers emit red luminescence (centered around 637 nm for a negatively charged NV center).

The emboldened levels correspond to the system isolated from its environment. Taking into consideration the interaction between the NV center and the surrounding crystal lattice causes additional levels to appear, which have been represented by thin lines (phonon broadening). The system, which initially is in the ground state, is raised to an excited state by absorption of a pump photon. Non-radiative recombination causes it to drop to the lowest-energy excited level (bold). The return to the ground state occurs via radiative decay which results in the emission of a luminescence photon in the red.

The NV center has a number of electronic configurations. The preferred configuration for the implementation of the invention is the negatively charged NV$^-$ configuration. Below, the notations NV$^-$ and NV will be used interchangeably to refer to the NV center according to the invention.

Figure 3:
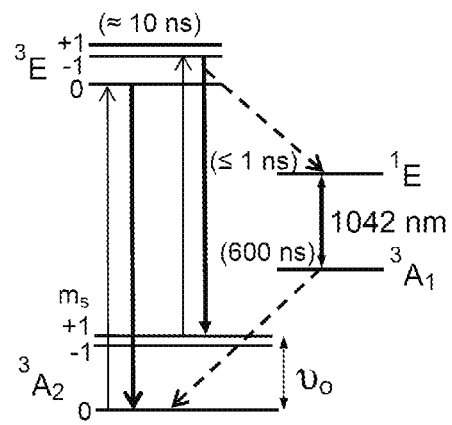
FIG. 3 illustrates the energy-level diagram of the NV center.

The NV$^-$ center is a two-electron system. The ground state level $^3A_2$ of the NV$^-$ center corresponds to an S=1 electron-spin triplet level—its structure is illustrated in FIG. 3.

The $m_s=0$ level and the $m_s=-1$ and $m_s=+1$ levels are not degenerate, both in the ground state $^3A_2$ ($\lfloor_0=2.88$ GHz) and in the excited state $^3E$. Radiative transitions are possible between identical spin levels ($m_s$). They are the origin of the luminescence of the NV$^-$ centers. A non-radiative decay pathway between the excited levels $m_s=+1$ and $m_s=-1$ and the ground-state level $m_s=0$ is possible via the levels $^1E$ and $^1A_1$. The $^1A_1$ level has a long lifetime (metastable level). This transition allows optical pumping of the NV$^-$ center with a polarization of the center mainly in the ground-state level $m_s=0$. This transition also explains the weaker luminescence of a center initially in the $m_s=+1$ or $m_s=-1$ state with respect to a center initially in the $m_s=0$ state.

A noteworthy property of NV$^-$ centers is therefore that it is possible to polarize spin in the $m_s=0$ state by optical pumping, then to detect the resonance of the transition $m_s=0 \rightarrow m_s=\pm1$ optically.

A first optical property is the sensitivity of the luminescence to a microwave-frequency signal and to the magnetic field, as explained below.

Figure 6:
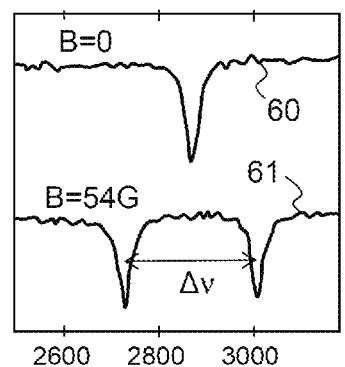
FIG. 6 illustrates the optical detection of the magnetic resonances as a function of resonant frequency f.sub.R, said resonances being displaced in the presence of a nonzero magnetic field by the Zeeman effect.

When the NV$^-$ center is subjected to microwave radiation of frequency $\lfloor_0=2.88$ GHz resonant with the transition $m_s=0 \rightarrow m_s=\pm1$, a decrease in the level of luminescence is observed, as illustrated by curve 60 in FIG. 6, thereby allowing the resonance to be detected (i.e. optically detected magnetic resonance or ODMR).

Figure 4:
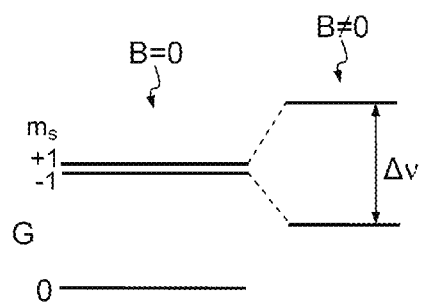
FIG. 4 illustrates the displacement of the levels under the Zeeman effect in the presence of a magnetic fields.

The Zeeman effect is observed when an exterior magnetic field is coupled to the magnetic moment of the electrons. It causes the levels $m_s=+1$ and $m_s=-1$ to lose their degeneracy, thereby causing two resonances located on either side of the central frequency of 2.88 GHz to appear, said resonances being separated by an interval $\Delta\lfloor$ such as illustrated in FIG. 4, where:

$$\Delta v = 2\frac{g\mu_B}{h}B_{NV}$$

g: is the Landé g-factor (very close to 2)
h: is Planck's constant (6.62 e-34 m² kg/s)
$\mu_B$: is the Bohr magneton (−9.274 e-24 J/T)
$B_{NV}$ is the component of the exterior magnetic field B projected onto the quantization axis $u_{NV}$ of the center NV⁻. The factor $$\frac{g\mu_B}{h}$$

is equal to 28 MHz/mT.

The position of these two frequencies varies proportionally to the amplitude of the magnetic field. As described above, a variation is therefore observed in the optical signal when the frequency of the microwave-frequency signal HF coincides with these two resonances as illustrated by the curve 61 in FIG. 6.

Figure 7:
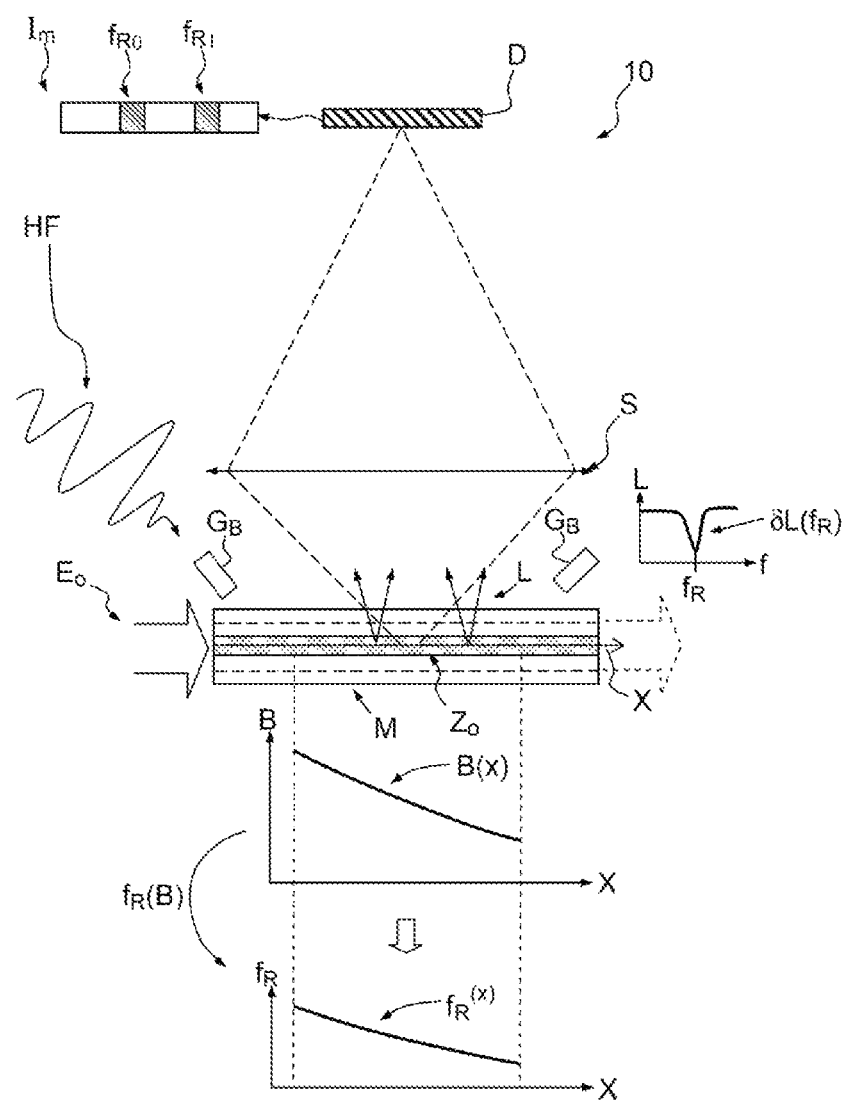
FIG. 7 illustrates a first mode of the system according to the invention, in which the optical property is luminescence.

Thus, according to a first mode illustrated in FIG. 7, the employed optical property of the material is a luminescence L, which results in an emission of light when the material is subjected to an excitation.

For a solid material M consisting of a diamond substrate comprising NV⁻ centers, the luminescence is preferably obtained by an optical excitation Eo, typically a light source, such as a pump laser, emitting in the visible, preferably in the band [400 nm; 650 nm].

As a variant, the luminescence is obtained by an electrical excitation Ee, i.e. by making an electrical current flow through the material. This may be achieved by creating a p-n junction in the vicinity of the NV⁻ centers.

When the frequency of the microwave-frequency signal HF coincides with a resonant frequency $f_R$ of the material, the intensity of the luminescence is modified, typically a decrease $\delta L$ in the intensity is observed.

According to one variant, the system furthermore comprises an optical system S configured to image the zone Zo on the detector D.

According to another variant, the detector is placed as close as possible to the emitting zone Zo. Thus, the correspondence between $x_0$, where the modification in the optical property of the material occurs, and the corresponding position $x_i$ on D is maintained.

Figure 8:
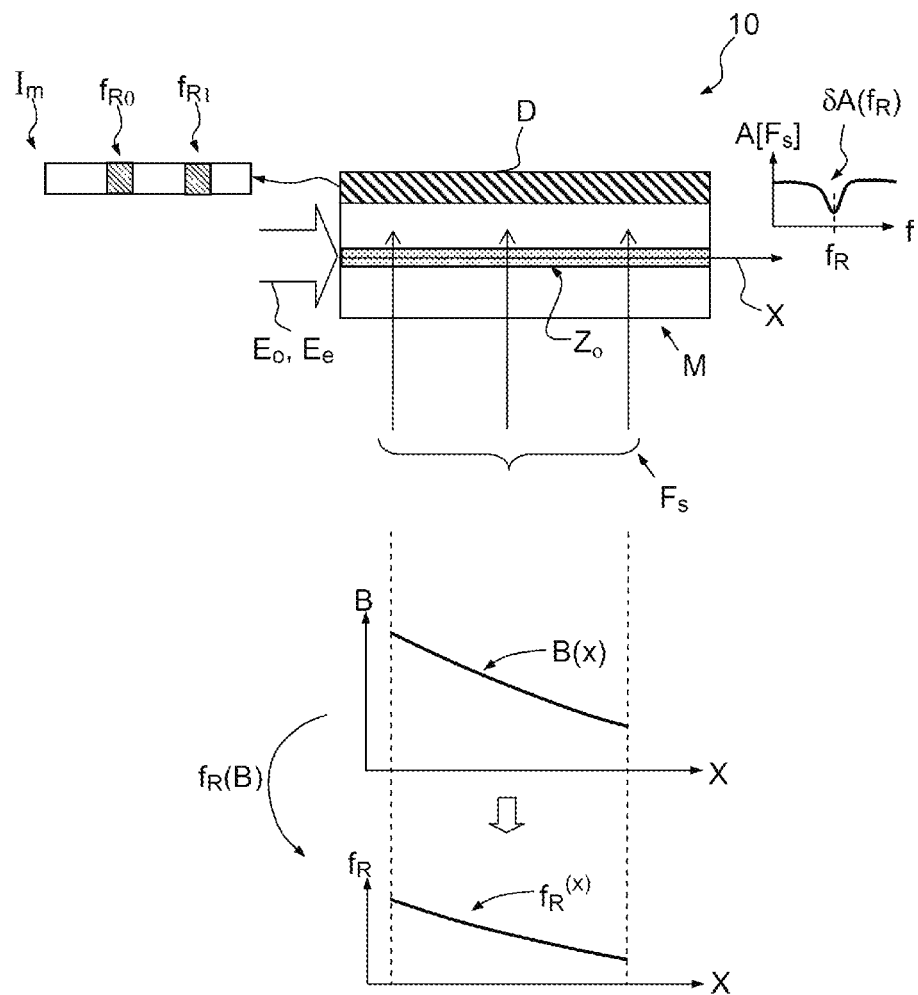
FIG. 8 illustrates a second mode of the system according to the invention, in which the optical property is the absorption of a probe beam.

According to a second mode, the characterizing optical property is the sensitivity of the absorption of a probe beam Fs passing through the zone Zo of the material M, to a microwave frequency HF and to the magnetic field. The application to a system 10 according to the invention is illustrated in FIG. 8, and described below, by way of nonlimiting example, for a diamond comprising NV⁻ centers.

The diamond comprising the NV centers, which are implanted near the surface or in the bulk of the diamond, absorbs some of the intensity of a probe beam of wavelength IR, typically 1042 nm. When the frequency of the microwave-frequency signal coincides with a resonant frequency $f_R$ of the diamond, 2.88 GHz in the absence of exterior magnetic field, the system may transition from the level $m_s=0$ to the levels $m_s=+1/-1$ of the triplet $^3A_2$, then to the level $m_s=+1/-1$ of the triplet $^3E$. From there, it may decay non-radiatively to the ground-state level $m_s=0$ via the metastable level. The long lifetime of this level (600 ms) with respect to the other levels allows a population to be accumulated in this level.

Using a probe beam resonant with the transition $^1A_1 \rightarrow ^1E$ (1042 nm), it is then possible to obtain an absorption signal that is proportional to the population of the $^1A_1$ level. If the frequency of the microwave-frequency signal is not resonant with the transition at 2.88 GHz, the process described above is no longer possible and the population of the level M is lower than in the preceding case. Therefore, the absorption of the probe beam is also lower. It may thus be seen that a variation $\delta A(f_R)$ in the absorption signal of the probe beam makes it possible to detect whether the microwave-frequency signal is resonant with the transition at 2.88 GHz.

In the case where a magnetic field is applied, the degeneracy of the levels $^3A_2$ $m_s=-1$ and $m_s=+1$ is lifted and two decreases in the absorption are observed as a function of frequency, corresponding to the two resonances. The profile of the transmitted probe signal is then similar to the profile depicted in FIG. 6.

It is possible to use a large-area probe beam so as to cover all the useful zone corresponding to the magnetic field gradient in order then to be able to form an image of the transmitted probe beam and thus measure the frequency of the microwave-frequency signal by measuring the position of the absorption increase.

For optimal reception of the variations in the intensity of the probe beam Fs, the detector D is preferably placed in proximity to the material M and for example makes direct contact with a surface of the material.

We will now describe preferred embodiments of the system 10 based on luminescence, these embodiments also being applicable to a system 10 based on the absorption of a probe beam.

In standard CVD diamonds, the NV centers are oriented along 4 different quantization axes $u_{NV1}$ to $u_{NV4}$ (corresponding to the 4 principal directions of the diamond crystal structure), and there are therefore 4 pairs of lines corresponding to the value of the projection of the magnetic field along each of these axes.

Figure 9:
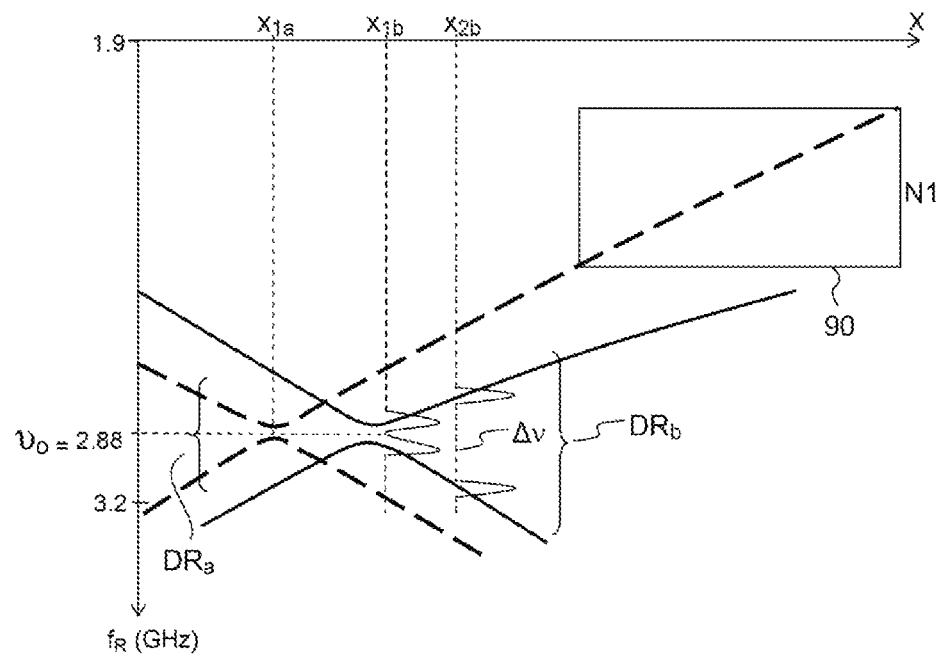
FIG. 9 illustrates an example of a variation in luminescence as a function of frequency and of position x in the presence of a magnetic field B(x)

When the diamond is placed in a magnetic field gradient B(x), the projection of B onto the 4 axes varies, and therefore the position of the resonant frequencies varies. FIG. 9 illustrates an example of luminescence as a function of the position x along the gradient (the general result depends on the configuration of the gradient and on the position of the diamond therein) and as a function of the microwave frequency $f_R$ in GHz. In this figure, the position x in the gradient is given on the abscissa, the frequency is given on the ordinate and the luminescence minima are shown in black.

By scanning the frequency, for example between 1.9 and 3.2 GHz, the position x of the resonant frequencies is moved. However, for a given position x, a number of frequencies may lead to resonance. There is one pair of hyperbola associated with each quantization axis. FIG. 9 shows two pairs associated with two quantization axes DRa (dashed) and DRb (solid line).

For the two quantization axes DRa and DRb, the curves giving the resonance as a function of position x are similar but offset. Thus the frequency $\lfloor 0$ is obtained for two different positions, x1a and x1b respectively. As may be seen in FIG.

9, for a given position x, a plurality of NV-center directions may give rise to resonances for different frequency values.

There is therefore an ambiguity between the measurement of the resonance at a given position x and the determination of the corresponding frequency $f_R(x)$.

A first way of removing this ambiguity is for example to limit measurement to a zone such as that indicated by the box 90: there is then a bijective relationship between frequency and position since to each frequency there corresponds only a single resonance and therefore only a single value of x.

Another solution consists in using crystals of [113] or [111] crystal growth orientation. In this case it is possible to obtain crystals in which the NV⁻ centers have a preferred direction DRp among the four possible, or indeed in which all the NV⁻ centers are oriented in the same direction DRp. These diamonds are obtained by CVD growth in one particular crystal direction: the [111] or [113] direction. It is then possible to dope the material during its growth with nitrogen in order to generate the NV centers, which then preferentially form in the growth direction.

Thus a single orientation direction is obtained for the NV centers and it is then possible with these crystals to obtain an unambiguous correspondence between position and frequency for the entire spectrum of interest.

To simplify the interpretation of the images, and to limit contrast decrease effects, the preferred direction DRp is preferably located in a plane of the material, this being achieved with a [111] crystal direction. Preferably this direction is substantially parallel to the direction X.

Figure 10:
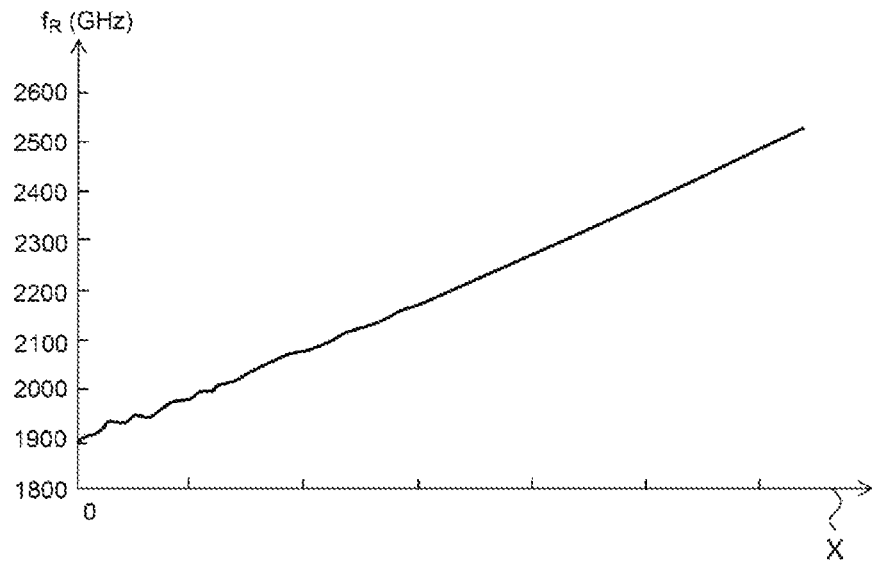
FIG. 10 illustrates a bijective relationship f.sub.R(x) obtained in a selected windows.

FIG. 10 illustrates, for frequencies comprised between 1.9 and 2.5 GHz, the bijective relationship $f_R(x)$ obtained in a selected window with a variation B(x) of about 10 mT over about 1 mm.

The curve giving the dependency of B(x) on x is similar to that giving the dependency of $f_R(x)$ on x, since the Zeeman effect is essentially linear for these values.

Figure 11A:
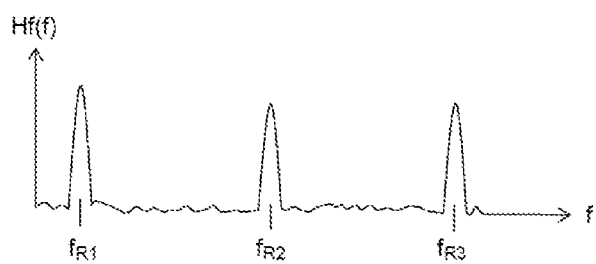
FIGS. 11A-11C illustrate the operation of the system for a case in which the microwave-frequency signal to be analyzed comprises 3 frequencies f.sub.R1, f.sub.R2, f.sub.R3.

FIG. 11 illustrates the operation of the system 10 for a simple case in which the microwave-frequency signal to be analyzed comprises 3 frequencies $f_{R1}$, $f_{R2}$, $f_{R3}$. FIG. 11a depicts the spectrum measured by a conventional spectrum analyzer. An optical system images the luminescence generated in the zone Zo subjected to a variable magnetic field B(x).

Figure 11B:
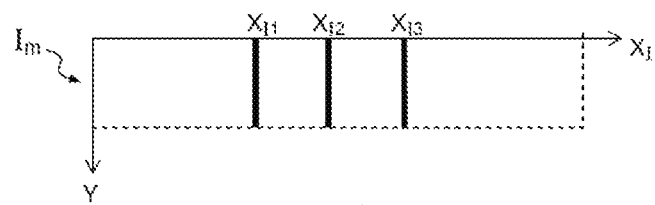

FIG. 11b illustrates the obtained image Im, which spatially encodes the 3 frequencies $f_{R1}$, $f_{R2}$, $f_{R3}$ in the form of three dark zones at the abscissae $X_{I1}$, $X_{I2}$, $X_{I3}$ of an axis $X_I$ related to the axis X by the magnification of the optical system.

Figure 11C:
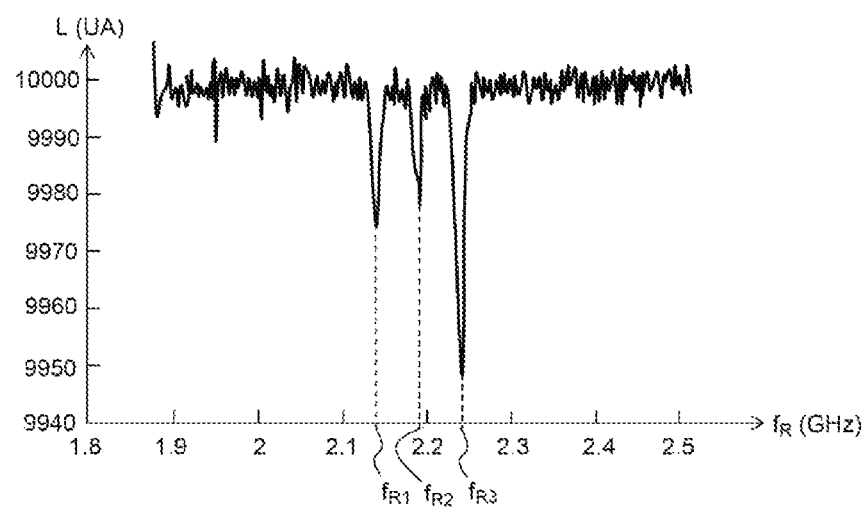

FIG. 11c illustrates, as a function of frequency, the curve of luminescence intensity L (arbitrary units) obtained from the image Im, the abscissa having been converted to the corresponding frequency using a calibration. Luminescence minima appear at the three frequencies $F_{R1}$, $F_{R2}$, $F_{R3}$ of the microwave-frequency signal HF irradiating the diamond.

Figure 12:
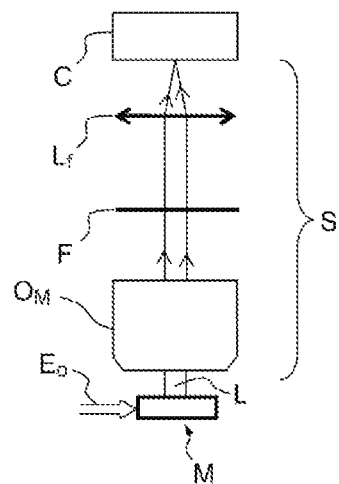
FIG. 12 illustrates an optical configuration of a system according to the invention and based on luminescence.

FIG. 12 illustrates an example of a system 10 based on luminescence. The optical excitation Eo, a beam from a pump laser configured to emit in the visible, for example at 532 nm, illuminates the material via its edge face and in the direction X of variation of the field B. The optical system S consists of a microscope objective $O_M$, of a filter F and of a focusing lens Lf. The detector D is part of a video camera C comprising a conventional two-dimensional detector, in CCD or CMOS technology for example. A 2-D image of the fluorescence is thus obtained. One advantage of this optical configuration is that the direction of the pump laser coincides with the direction X, thereby allowing a zone Zo of substantial size to be effectively used and with a good pumping uniformity.

Figure 13:
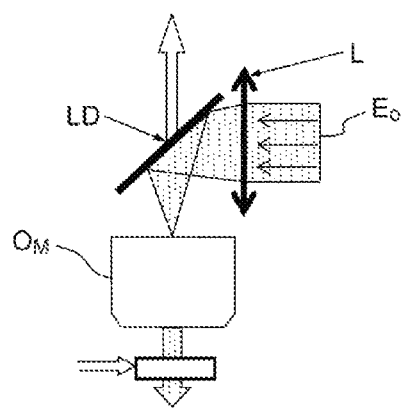
FIG. 13 illustrates another optical configuration of the system according to the invention and based on luminescence.

According to another variant illustrated in FIG. 13, the optical excitation Eo is applied from above via the microscope objective $O_M$, using a dichroic filter LD.

By way of illustration, the inventors have carried out experiments in the configuration illustrated in FIG. 12, with a laser-pump power of 300 mW, and an image-acquisition Im time of 4 ms. It would be possible to decrease the power of the laser and the acquisition time if a diamond having a much higher density of NV centers than the diamond used in this demonstration experiment were used.

Figure 14:
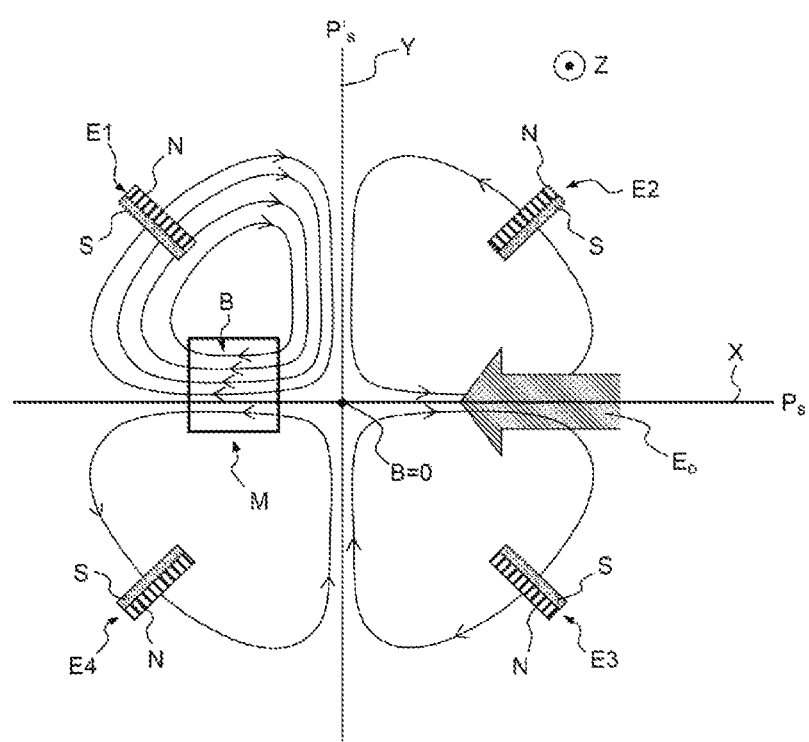
FIG. 14 illustrates an example of generation of a variable magnetic field B(x)

FIG. 14 illustrates one example of generation of a variable magnetic field B(x), which is conventionally used to trap cold atoms.

The generator $G_B$ comprises four magnets E1, E2, E3, E4 placed at 45° with respect to two perpendicular planes of symmetry Ps, Ps'. At the intersection between the two planes is a zone in which the magnetic field is zero. The material is placed perpendicularly to the planes of symmetry, the zone Zo being located in the vicinity of an intersection with one of the planes of symmetry but not containing the intersection between the two planes of symmetry. In this particular configuration of magnets, in at least one region the amplitude of the magnetic field is a monotonically increasing function of abscissa, in a plane of symmetry. Thus, the plane of symmetry along which the material is positioned corresponds to the direction X. A monotonic variation in the magnetic field allows a wide range of resonant frequencies to be obtained.

Preferably, the direction of the magnetic field is substantially aligned (to within +/−20°) with a quantization direction of the NV centers. This makes it possible to maximize the projection of the magnetic field with respect to the preferred direction of the NV⁻ centers, to preserve the linearity of the Zeeman effect over a larger frequency range and to prevent contrast decrease effects when the transverse component of the field (component perpendicular to the quantization axis) becomes too great.

In addition, the interpretation of the data is simplified and the exploitable frequency excursion is maximized.

Specifically, the origin of the contrast decrease effect is an alignment error between the axis of the NV center and the direction of the magnetic field. When the magnetic field becomes too strong, it and not the orientation of the NV center sets the quantization axis. If the magnetic field has a substantial transverse component, the eigenstates of the system are no longer the spin states $m_s=-1$, $m_s=0$, $m_s=+1$, but linear combinations thereof. Therefore, the difference in luminescence as a function of the starting state is less marked and eventually disappears entirely if the field is very strong. This is the contrast decrease effect. In a configuration in which the field is aligned with a quantization direction of the NV centers, a large spectral scan range is achieved, typically several tens of GHz, without losing the luminescence properties of the NV centers.

Apart from the aforementioned advantage, alignment of the magnetic field with one of the NV-center directions has an additional advantage when the centers may be in any of the four orientations that are possible in diamond. Aligning the magnetic field with one of the orientation directions of the NV centers allows said orientation to be selected when the magnetic field is strong enough. The three other possible directions, which are not aligned with the magnetic field, see the contrast of their resonances decrease and the corresponding signals disappear. There therefore then remains only a single pair of resonances, thereby achieving a similar effect to the one that is achieved with a crystal in which the NV centers have a single preferred direction.

When the preferred direction DRp exists, the magnetic field is advantageously aligned with this direction.

When the quantization axis of the NV⁻ centers is not contained in a plane of the substrate, one option is to incline the magnets with respect to the diamond. By correctly aligning the field, an analysis range of as large as 30 GHz is obtained in the case where the magnets used produce a surface field of 1 T (the upper limit is determined by the amplitude of the magnetic field). A passband of 30 GHz divided by a resolution of 5 MHz corresponds to about 6000 analysis channels.

Preferably, the magnetic field generator $G_B$ is configured so that the direction of the magnetic field is contained in a plane of the material. Preferably, the magnetic field generator $G_B$ is configured so that the direction of the magnetic field is parallel to the direction X, this being the case for the configuration in FIG. 14. This simplifies the overall geometry of the system and allows the analyzed frequency range to be maximized.

Thus, one advantageous configuration is to align, with the direction X (which is located in a plane of the material), the direction of the magnetic field, the preferred direction of the NV centers and the direction of the pump laser.

Advantageously, the magnetic field generator $G_B$ is configured so that the amplitude of the magnetic field is substantially constant in a direction Z perpendicular to a plane XY of the material. This feature is obtained with the configuration in FIG. 14 for magnets that are elongate in the direction Z, this ensuring the invariance of the field in Z. This makes it possible to ensure that all the NV⁻ centers located along an axis Z and having the same coordinates (x, y) have the same resonant frequency. It is therefore possible to sum all their contributions to form the signal corresponding to a given pixel of the field of the video camera containing the detector.

Advantageously, an invariance of the field in Y is achieved when the width of the beam of the pump laser is small with respect to the distance to the magnets. The position of the resonance is therefore invariant in Y, thereby allowing all the contributions of each y for a given x to be summed, and thus sensitivity to be improved.

Figure 15:
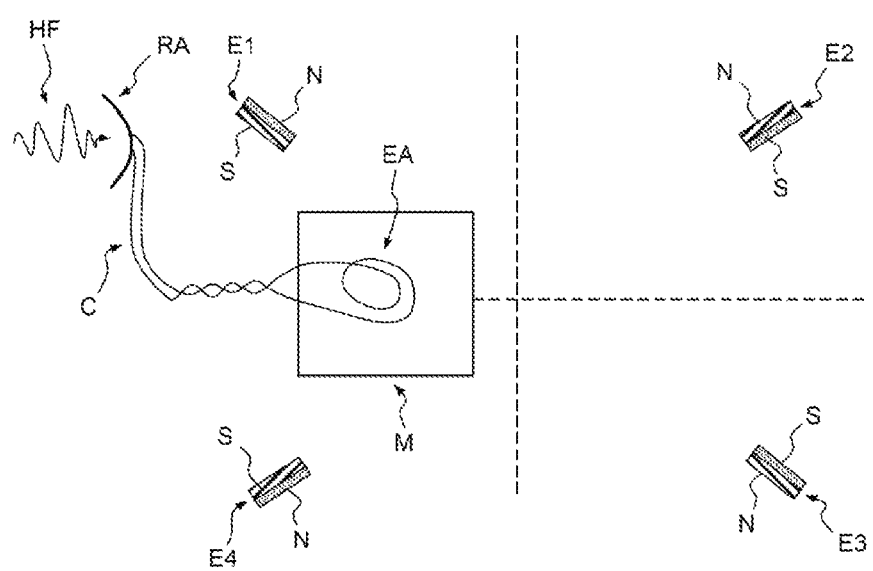
FIG. 15 illustrates a system according to the invention comprising an emitting antenna placed in proximity to the material.

In order to apply the signal HF to be analyzed to the system according to the invention more effectively, the system 10 advantageously comprises an emitting antenna EA placed in proximity to the material M and connected to a coaxial cable C inside of which the microwave-frequency signal HF to be analyzed propagates, such as illustrated in FIG. 15.

Advantageously, the cable C is connected to a receiving antenna RA in order to better capture the signal HF. The emitting antenna EA for example comprises a loop allowing a uniform field to be obtained in the crystal.

The system 10 of the preceding demonstration experiment has a sensitivity allowing signals of a power at least as low as −10 dBm to be detected with an acquisition time of 20 seconds (power measured by the generator at the input of the coaxial cable leading to the emitting antenna). This sensitivity would be improved if a more suitable antenna, i.e. one allowing the microwave-frequency field to be more effectively concentrated on the useful zone, such as an antenna of rectangular rather than circular shape, were used.

Figure 16:
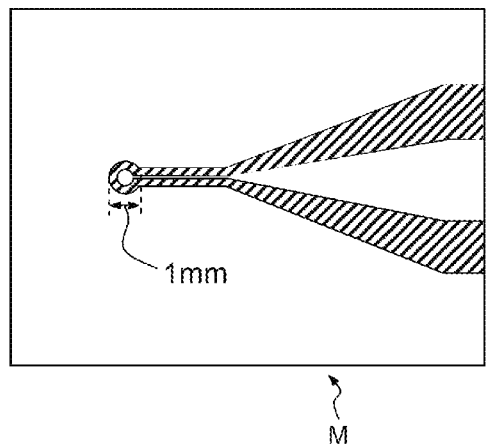
FIG. 16 schematically shows an emitting antenna produced by lithography on the surface of the material.
Figure 17:
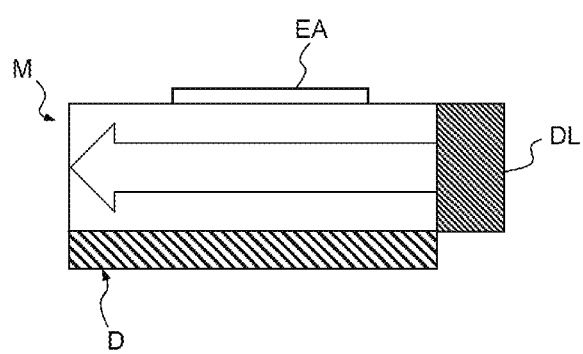
FIG. 17 illustrates a compact system according to the invention.

To obtain a compact system, the emitting antenna is produced by lithography on the surface of the material, as FIGS. 16 and 17 illustrate. FIG. 17 illustrates a system 10 of optimized compactness. The pump laser is a laser diode DL making direct contact with the diamond, a CCD sensor is adhesively bonded directly to the diamond and the antenna EA is produced by lithography on its surface, on the side opposite the CCD detector.

Figure 18:
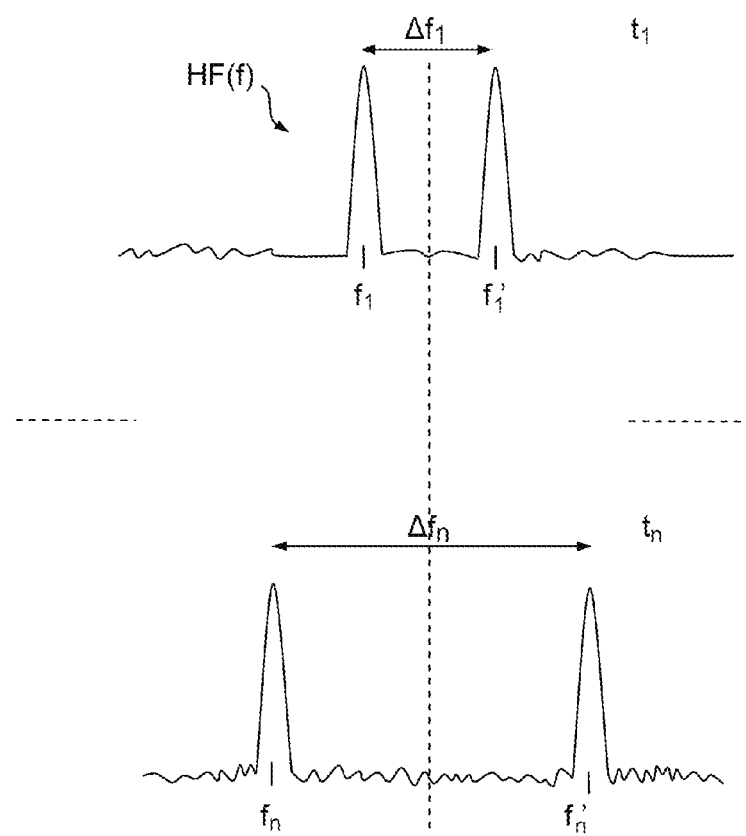
FIG. 18 illustrates a time-dependent microwave-frequency signal HF to be analyzed.
Figure 19:
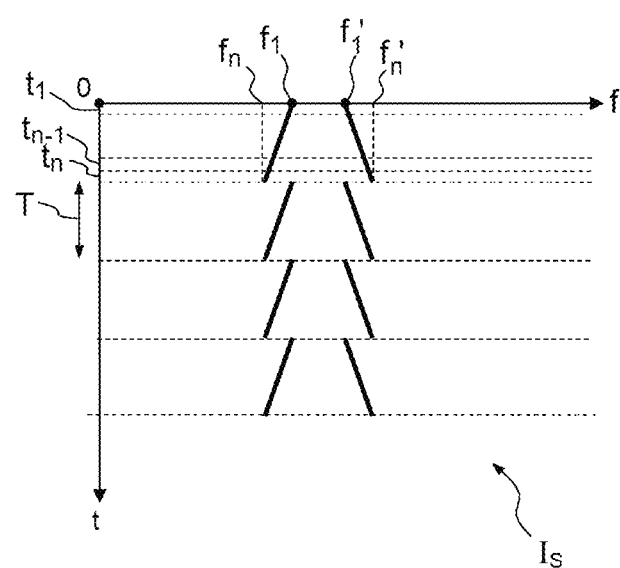
FIG. 19 schematically shows a synthetic image obtained with a system according to the invention comprising a processing device.

According to one variant, and in order to make it possible to see all the spectrum to be analyzed and its variation over time, the system 10 according to the invention furthermore comprises a processing device configured to acquire a plurality of images Im1, Im2, ... Imn at successive times t1, t2 ... , tn, respectively, and to generate a synthetic two-dimensional image Is by juxtaposing the acquired spectral images Im1, Im2, ... Imn, so as to visually render any variation in the spectrum of the microwave-frequency signal HF to be analyzed as a function of time. A synthetic image is illustrated in FIG. 19 for the bi-frequency signal HF to be analyzed illustrated in FIG. 18, the two frequencies being separated by a frequency interval Δf that varies over a period T between a value $\Delta f_1$ and a value $\Delta f_n$.

Such a synthetic image is commonly called a spectrogram, and gives a specialist an instantaneous overview of how the spectrum is varying over time.

According to another aspect, the invention relates to a method for analyzing a microwave-frequency signal HF by imaging, comprising steps consisting in:

optically or electrically exciting a zone Zo of a solid material M at least one optical property of which is modifiable in said zone when said zone is simultaneously in the presence of said excitation and a microwave-frequency signal having at least one frequency coinciding with a resonant frequency $f_R$ of the material, the material furthermore being such that a value of the resonant frequency $f_R(B)$ varies as a function of the amplitude of a magnetic field, generating a magnetic field B having, in the interior of a portion of said zone, a spatial amplitude variation B(x), the material then having a resonant frequency $f_R(x)$ that is dependent on a position x in the direction X, receiving on a detector D an image Im of the zone Zo in the direction X, the image Im containing at least one intensity variation δI a position of which in the image depends on a corresponding frequency value of the microwave frequency signal HF to be analyzed illuminating the material M, when the portion of the zone of the material is simultaneously optically or electrically excited and subjected to the magnetic field B.

Advantageously, the method furthermore comprises steps consisting in acquiring a plurality of images Im1, Im2, Imn at successive times t1, t2 ... , tn and in generating a two-dimensional synthetic image Is by juxtaposing the acquired images, so as to visually render a variation in the spectrum of the microwave-frequency signal HF to be analyzed as a function of time.

Advantageously, the method furthermore comprises a calibrating step consisting in generating a synthetic image from a mono-frequency microwave-frequency signal the frequency of which varies as a function of time according to a known law, so as to obtain a correspondence between position in the image and resonant frequency. It is for example possible to use a calibration signal corresponding to a known monochromatic signal the frequency of which is varied. The resonant frequency is then determined for each value of x, thereby allowing the frequency/position correspondence to be obtained.

The invention claimed is:

1. A system for analyzing a microwave-frequency signal by imaging, comprising:

a solid material at least one optical property of which is modifiable in at least one zone (Zo) of said material, when said zone is simultaneously in the presence of an optical excitation or electrical excitation and said microwave-frequency signal having at least one frequency coinciding with a resonant frequency of the material, said material furthermore being such that a value of said resonant frequency varies as a function of the amplitude of a magnetic field, a magnetic field generator configured to generate a magnetic field having, in the interior of a portion of said zone, a spatial amplitude variation in a direction X, said material then having a resonant frequency that is dependent on a position (x) in said direction X, and a detector configured to receive an image of said zone (Zo) in said direction X, said image containing at least one intensity variation resulting from the modification of the optical property, a position of which in the spectral image depends on a corresponding frequency value of said microwave frequency signal to be analyzed illuminating said zone of the material, when said zone is simultaneously in the presence of the optical excitation (Eo) or electrical excitation and said magnetic field.

2. The system as claimed in claim 1, wherein the material is of planar geometry, the direction X being substantially contained in a plane of the material.

3. The system as claimed in claim 1, wherein the material is a crystal comprising color centers.

4. The system as claimed in claim 3, wherein the crystal is a diamond substrate comprising NV centers in the crystal lattice of said substrate, each NV center consisting of a nitrogen atom substituted for a carbon atom and coupled to a vacancy, the nitrogen-atom/vacancy pair forming a color center in said crystal lattice.

5. The system as claimed in claim 1, wherein said optical property is an absorption of a probe optical beam passing through said zone (Zo), said modification consisting of a variation in said absorption of said probe optical beam by said zone of the material.

6. The system as claimed in claim 1, wherein said optical property is a luminescence, said modification comprising a variation in a light intensity of said zone (Zo), said system furthermore comprising an optical system configured to image said zone (Zo) on said detector.

7. The system as claimed in claim 3, wherein said NV centers of the diamond substrate have a preferred direction among the four possible directions.

8. The system as claimed in claim 7, wherein the preferred direction of the NV centers is located in a plane of the material.

9. The system as claimed in claim 8, wherein the preferred direction of the NV centers corresponds to the direction X.

10. The system as claimed in claim 1, wherein the magnetic field generator is configured so that the spatial variation in the amplitude of the magnetic field is monotonic in X in said portion of the zone (Zo).

11. The system as claimed in claim 3, wherein the magnetic field generator is configured so that the direction of the magnetic field is substantially aligned with a direction of the NV centers.

12. The system as claimed in claim 2, wherein the magnetic field generator is configured so that the direction of the magnetic field is contained in a plane of the material.

13. The system as claimed in claim 2, wherein the magnetic field generator is configured so that the direction of the magnetic field is parallel to the direction X.

14. The system as claimed in claim 2, wherein the magnetic field generator is configured so that the amplitude of the magnetic field is substantially constant in a direction Z perpendicular to a plane of the material.

15. The system as claimed in claim 1, furthermore comprising an emitting antenna placed in proximity to said material and connected to a coaxial cable inside of which the microwave-frequency signal to be analyzed propagates.

16. The system as claimed in claim 1, comprising a processing device configured to acquire a plurality of images at successive times (t1, t2 . . . , tn) and to generate a two-dimensional synthetic image by juxtaposing the acquired spectral images, so as to visually render a variation in the spectrum of the microwave-frequency signal to be analyzed as a function of time.

17. A method for analyzing a microwave-frequency signal by imaging, comprising:

optically or electrically exciting a zone (Zo) of a solid material at least one optical property of which is modifiable in said zone when said zone is simultaneously in the presence of said excitation and said microwave-frequency signal having at least one frequency coinciding with a resonant frequency of the material, said material furthermore being such that a value of the resonant frequency varies as a function of the amplitude of a magnetic field, generating a magnetic field having, in the interior of a portion of said zone, a spatial amplitude variation, said material then having a resonant frequency that is dependent on a position (x) in said direction X, receiving on a detector an image of said zone (Zo) in said direction X, said image containing at least one intensity variation a position of which in said image depends on a corresponding frequency value of said microwave frequency signal to be analyzed illuminating said material, when said portion of the zone of the material is simultaneously optically or electrically excited and subjected to said magnetic field.

18. The method as claimed in claim 17, furthermore comprising acquiring a plurality of images at successive times (t1, t2 . . . , tn) and generating a two-dimensional synthetic image by juxtaposing the acquired images, so as to visually render a variation in the spectrum of the microwave-frequency signal to be analyzed as a function of time.

19. The method as claimed in claim 17, furthermore comprising a calibrating step consisting in generating a synthetic image from a mono-frequency microwave-frequency signal the frequency of which varies as a function of time according to a known law, so as to obtain a correspondence between position in the image and resonant frequency.

* * * * *